(12) United States Patent
Shibayama et al.

(10) Patent No.: US 9,184,368 B2
(45) Date of Patent: Nov. 10, 2015

(54) FILM-TYPE PIEZOELECTRIC/ELECTROSTRICTIVE ELEMENT

(71) Applicant: NGK Insulators, Ltd., Nagoya-Shi (JP)

(72) Inventors: Kohji Shibayama, Handa (JP); Haruhiko Ito, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/517,020

(22) Filed: Oct. 17, 2014

(65) Prior Publication Data

US 2015/0035414 A1 Feb. 5, 2015

Related U.S. Application Data

(63) Continuation of application No. PCT/JP2013/053820, filed on Feb. 18, 2013.

(30) Foreign Application Priority Data

Apr. 19, 2012 (JP) ................. 2012-095804

(51) Int. Cl.
*H01L 41/083* (2006.01)
*H01L 41/047* (2006.01)
(Continued)

(52) U.S. Cl.
CPC .......... *H01L 41/047* (2013.01); *H01L 41/0471* (2013.01); *H01L 41/0477* (2013.01);
(Continued)

(58) Field of Classification Search
CPC .......................... H01L 41/083; H01L 41/0471
USPC .......................................... 310/328, 364–365
See application file for complete search history.

(56) References Cited

U.S. PATENT DOCUMENTS 6,278,227 B1* 8/2001 Katsuno et al. ............... 310/359
2002/0017832 A1* 2/2002 Murai et al. .................. 310/328

(Continued)

FOREIGN PATENT DOCUMENTS

JP 2008-508737 A1 3/2008
JP 2008-112809 A1 5/2008
(Continued)

OTHER PUBLICATIONS

International Preliminary Report on Patentability (Application No. PCT/JP2013/053820) dated Dec. 2, 2014.
(Continued)

*Primary Examiner* — J. San Martin
(74) *Attorney, Agent, or Firm* — Burr & Brown, PLLC

(57) ABSTRACT

A film-type piezoelectric/electrostrictive element which is a fired object includes a body part, a pair of side-surface electrodes and an electrode exposed surface. The body part has n+1 layered piezoelectric/electrostrictive films and n layered internal electrode layer(s). The piezoelectric/electrostrictive films are composed of ceramic. The piezoelectric/electrostrictive films and the internal electrode layer(s) are stacked in an alternating manner. The n is an integer equal to 1 or more. The pair of side-surface electrodes is positioned on two opposing side surfaces of the body part. The two opposing side surfaces extend in a stacking direction of the body part. The internal electrode layer(s) is/are exposed on an electrode exposed surface of the body part. The electrode exposed surface extends in the stacking direction. An electrode exposure ratio of the internal electrode layer(s) on the electrode exposed surface as defined by Formula (1) being more than 0% and less than or equal to 10%.

The electrode exposure ratio (%)=$A1/(L1 \times L2) \times 100$     (1)

A1 denotes an exposed area of the internal electrode layer(s) exposed on an active portion of the electrode exposed surface. L1 denotes an average thickness of the internal electrode layer(s). L2 denotes a sum length of each of the internal electrode layer(s) in a lengthwise direction on the active portion of the electrode exposed surface. The lengthwise direction is perpendicular to the stacking direction.

9 Claims, 7 Drawing Sheets

(51) Int. Cl.
*H01L 41/09* (2006.01)
*H01L 41/273* (2013.01)
*H01L 41/187* (2006.01)
*B06B 1/06* (2006.01)

(52) U.S. Cl.
CPC .......... *H01L41/083* (2013.01); *H01L 41/0973* (2013.01); *H01L 41/1875* (2013.01); *H01L 41/273* (2013.01); *B06B 1/0688* (2013.01)

(56) References Cited

U.S. PATENT DOCUMENTS

| 2002/0150508 | A1* | 10/2002 | Nagaya et al. | 422/98 |
| 2004/0185278 | A1* | 9/2004 | Sato | 428/469 |
| 2008/0030105 | A1 | 2/2008 | Florian et al. | |
| 2010/0282874 | A1 | 11/2010 | Nakamura et al. | |
| 2015/0016018 | A1* | 1/2015 | Onishi et al. | 361/301.4 |
| 2015/0048722 | A1* | 2/2015 | Richter et al. | 310/365 |
| 2015/0076967 | A1* | 3/2015 | Kim et al. | 310/364 |

FOREIGN PATENT DOCUMENTS

| JP | 2011-065255 A1 | 3/2011 |
| WO | 2007/049697 A1 | 5/2007 |

OTHER PUBLICATIONS

International Search Report (Application No. PCT/JP2013/053820) dated Mar. 26, 2013.

* cited by examiner

FILM-TYPE PIEZOELECTRIC/ELECTROSTRICTIVE ELEMENT

CROSS-REFERENCE TO RELATED APPLICATIONS

This application is a continuation application of International Application No. PCT/20131053820, filed Feb. 18, 2013, which claims priority to Japanese Patent Application No. 2012-095804, filed on Apr. 19, 2012. The entire disclosures of International Application No. PCT/2013/053820 and Japanese Patent Application No. 2012-095804 are hereby incorporated herein by reference.

BACKGROUND OF THE INVENTION

1. Field of the Invention

The present invention relates to a film-type piezoelectric/electrostrictive element.

2. Description of Related Art

When a film-type piezoelectric/electrostrictive element configured by stacking a piezoelectric/electrostrictive film with an electrode layer is driven for a long time for example in a high-temperature/high humidity environment, the problem arises that the insulating performance is adversely affected on the side surface in the stacking direction, and this fact results in a fall in the electrical energy efficiency due to leakage currents, and product malfunctioning due to short circuits between the electrodes.

In a piezoelectric device, the piezoelectric layer has a function of maintaining the insulating performance between the electrodes in addition to a function of deforming in response to a potential difference produced by the electrodes that are positioned on both surfaces (upper and lower surfaces) of the layer. Therefore, the provision of a single low thickness layer in the plurality of piezoelectric layers contained in the piezoelectric device causes an imbalance in the insulating performance between the electrodes and is disadvantageous in respective of maintaining stable operating characteristics.

In order to solve the above problems, a green sheet has been proposed that is configured with a uniform thickness in a plurality of ceramic layers (piezoelectric layers) obtained by firing and in which the plurality of ceramic sheets (piezoelectric sheets) is resistant to deformation. (Reference is made to Japanese Patent Application No. 2011-65255).

SUMMARY OF THE INVENTION

The present invention is proposed in light of the above problems in the prior art techniques and has the object of providing a film-type piezoelectric/electrostrictive element, a method of manufacturing the element, and an actuator, an ultrasonic sensor, an acceleration sensor, an angular velocity sensor, an impact sensor, or a mass sensor that is provided with the element, in which the film-type piezoelectric/electrostrictive element is configured by reducing the exposed surface area of the electrodes on the side surface of the film-type piezoelectric/electrostrictive element with reference to the stacking direction while maintaining the effective electrode surface area to thereby reduce the possibility of a reduction in insulation.

Solution to Problem

The present inventors performed diligent investigation to attain the above object and completed the present invention on the basis of the insight that it is possible to manufacture a film-type piezoelectric/electrostrictive element that maintains both insulating performance and current flow by limiting the exposure configuration of the electrodes in the manufacturing method of a conventionally stacked, film-type piezoelectric/electrostrictive element that includes a stacking step and a firing step.

That is to say, the present invention provides a film-type piezoelectric/electrostrictive element which is a fired object includes a body part, a pair of side-surface electrodes and an electrode exposed surface. The body part has n+1 layered piezoelectric/electrostrictive films and n layered internal electrode layer(s). The piezoelectric/electrostrictive films are composed of ceramic. The piezoelectric/electrostrictive films and the internal electrode layer(s) are stacked in an alternating manner. The n is an integer equal to 1 or more. The pair of side-surface electrodes is positioned on two opposing side surfaces of the body part. The two opposing side surfaces extend in a stacking direction of the body part. The internal electrode layer(s) is/are exposed on an electrode exposed surface of the body part. The electrode exposed surface extends in the stacking direction. An electrode exposure ratio of the internal electrode layer(s) on the electrode exposed surface as defined by Formula (1) being more than 0% and less than or equal to 10%.

$$\text{The electrode exposure ratio (\%)} = A1/(L1 \times L2) \times 100 \quad (1)$$

A1 denotes an exposed area of the internal electrode layer(s) exposed on an active portion of the electrode exposed surface. L1 denotes an average thickness of the internal electrode layer(s). L2 denotes a sum length of each of the internal electrode layer(s) in a lengthwise direction on the active portion of the electrode exposed surface. The lengthwise direction is perpendicular to the stacking direction.

Preferably, the internal electrode layer(s) has/have a plurality of exposed portions on the electrode exposed surface. A size of each of the exposed portions exhibits a ratio of L3/L1 after firing of 0.5 to 20. L3 denotes a length of each of the exposed portions in the lengthwise direction on the internal electrode layer(s).

A film thickness of the piezoelectric/electrostrictive films is preferably 3 to 200 micrometers.

A thickness of the internal electrode layer(s) is preferably 0.3 to 2.0 micrometers.

Furthermore, a ratio of a film thickness of the piezoelectric/electrostrictive films and a film thickness of the internal electrode layer(s) is preferably 2 to 200 when expressed as (the film thickness of piezoelectric/electrostrictive films)/(the film thickness of the internal electrode layer(s)).

Preferably, the n takes a value of 1 to 10, and the n layered internal electrode layer(s) are/is disposed in a staggered comb-like configuration in the stacking direction on the electrode exposed surface.

The piezoelectric/electrostrictive film may contain at least one oxide, or a mixture of oxides, selected from the group consisting of lead zirconate, lead titanate, lead magnesium niobate, lead nickel niobate, lead zinc niobate, lead manganese niobate, lead antimony stanate, lead manganese tungstate, lead cobalt niobate, barium titanate, bismuth sodium titanate, sodium potassium niobate, strontium bismuth tantalite, or the like.

The internal electrode layer preferably contains at least one type of metal selected from the group consisting of Pt, Pd, Ru, Rh, Ni, Cu, Ag, Os and Ir.

The present invention provides an actuator, an ultrasonic sensor, an acceleration sensor, an angular velocity sensor, an impact sensor, or a mass sensor that is provided with the piezoelectric/electrostrictive element.

The present invention provides a film-type piezoelectric/electrostrictive element, a method of manufacturing the element, and an actuator, an ultrasonic sensor, an acceleration sensor, an angular velocity sensor, an impact sensor, or a mass sensor that is provided with the element, wherein the film-type piezoelectric/electrostrictive element is configured by reducing the exposed surface area of the electrodes on the side surface of the film-type piezoelectric/electrostrictive element with reference to the stacking direction while maintaining the effective electrode surface area, and that reduces the possibility of a reduction in insulation.

BRIEF DESCRIPTION OF DRAWINGS

Referring now to the attached drawings, which form a part of this original disclosure.

DETAILED DESCRIPTION OF THE INVENTION (1) Film-Type Piezoelectric/Electrostrictive Element The film-type piezoelectric/electrostrictive element according to the present invention includes a body part having n+1 layered (n being an integer equal to 1 or more) ceramic piezoelectric/electrostrictive films, and n layered internal electrode layer(s) in which the piezoelectric/electrostrictive films and the internal electrode layer(s) are stacked in an alternating manner with one another. It is preferred that n is an integer of 1 to 10. The film-type piezoelectric/electrostrictive element also includes a pair of side-surface electrodes positioned on two opposing side surfaces in the stacking direction of the body part. The film-type piezoelectric/electrostrictive element is a fired object configured from a stacked body of the above features. The side surface electrode may be connected to the internal electrode layer. Furthermore, an electrode exposed surface where the internal electrode layer is exposed is provided on a side surface of the element in the stacking direction of the piezoelectric/electrostrictive film and the internal electrode layer. Furthermore, the internal electrode may be disposed in a staggered comb-like configuration in a lengthwise direction perpendicular to the stacking direction.

Figure 1:
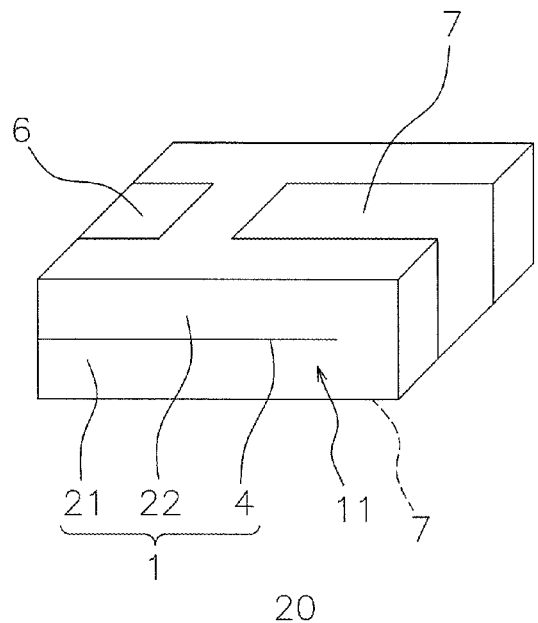
FIG. 1 is a perspective view schematically illustrating a film-type piezoelectric/electrostrictive element according to a first aspect of an embodiment of the present invention.
Figure 2:
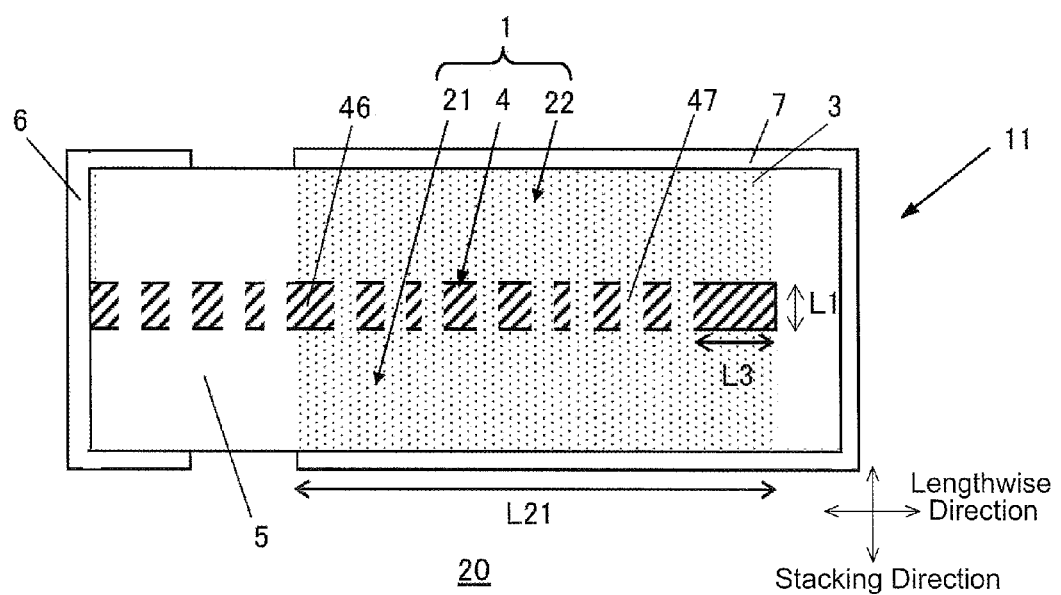
FIG. 2 schematically illustrates the electrode exposed surface of the film-type piezoelectric/electrostrictive element according to the first aspect of an embodiment of the present invention.

With reference to the film-type piezoelectric/electrostrictive element 20 according to the first aspect of an embodiment of the invention that is schematically illustrated in FIG. 1 and FIG. 2, a body part 1 is provided with a stacked configuration in which an internal electrode layer 4 is disposed between two ceramic layers of a piezoelectric/electrostrictive film 21, 22 (n=1). Furthermore, side surface electrodes 6, 7 are provided on the two opposing side surfaces in the stacking direction of the body part 1. The side surface electrodes 6, 7 are provided in a continuous configuration with the side surface on both the upper surface and the lower surface of the body part 1. The side surface electrode 6 is connected on the side surface with the internal electrode layer 4. The internal electrode layer 4 is exposed on the electrode exposed surface 11. In the present specification, the reference numerals that denote a layer may attach the same symbol before and after firing.

Figure 3:
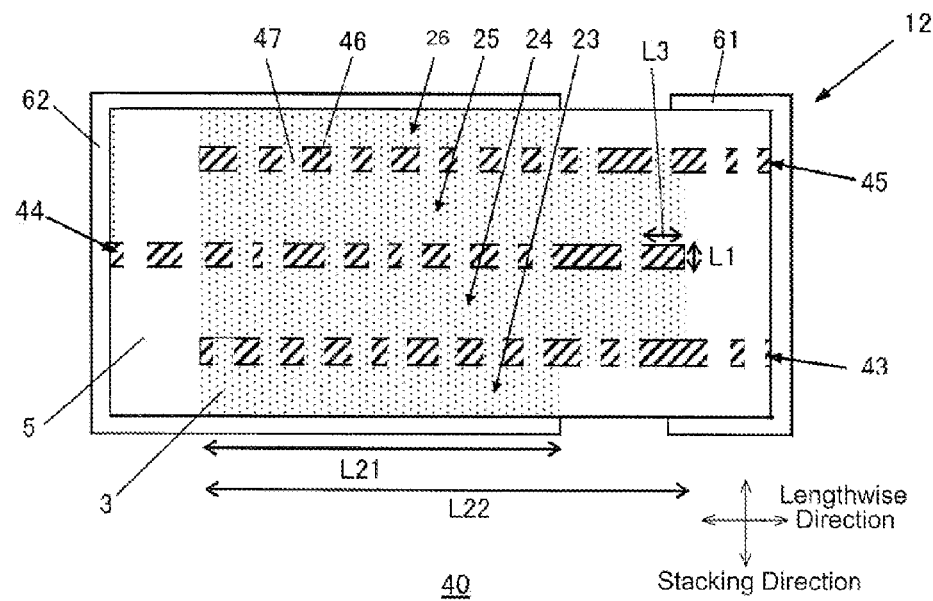
FIG. 3 schematically illustrates the electrode exposed surface of the film-type piezoelectric/electrostrictive element according to an aspect of another embodiment of the present invention.

FIG. 3 schematically illustrates the electrode exposed surface 12 of the film-type piezoelectric/electrostrictive element 40 according to an aspect of another embodiment of the present invention. In this context, the body part is formed by four piezoelectric/electrostrictive films 23 to 26, and three internal electrode layers 43 to 45 (n=3). The three internal electrode layers 43 to 45 are provided in a comb shaped configuration with a mutual difference in a lengthwise direction perpendicular to the stacking direction. The side surface electrode 61 is connected on one side surface with the internal electrode layers 43, 45 and connected on the other side surface with the internal electrode layer 44. The electrode exposed surface 12 may be a cut surface. The electrode exposed layer in the present specification denotes a portion of the side surface in the stacking direction of the internal electrode layer and the piezoelectric/electrostrictive film without a side surface electrode, and a portion of the internal electrode layer may be exposed.

(1-1) Piezoelectric/Electrostrictive Film

The piezoelectric/electrostrictive film in the film-type piezoelectric/electrostrictive element of the present invention is manufactured of a ceramic, and includes starting materials such as a piezoelectric ceramic, an electrostrictive ceramic, a ferroelectric ceramic, or an antiferroelectric ceramic, or the like. These materials may be used by suitable selection in response to various uses.

The piezoelectric ceramic, electrostrictive ceramic, ferroelectric ceramic, or antiferroelectric ceramic includes a ceramic (oxide) that contains one of the following substances in isolation, or as a mixture thereof: lead zirconate, lead titanate, lead magnesium niobate, lead nickel niobate, lead zinc niobate, lead manganese niobate, lead antimony stanate, lead manganese tungstate, lead cobalt niobate, barium titanate, bismuth sodium titanate, sodium potassium niobate, strontium bismuth tantalite, or the like. The dimensions of the ceramic particles that configure the piezoelectric/electrostrictive film are preferably 0.05 to 1.5 micrometers.

The thickness of the piezoelectric/electrostrictive film is for example, 3 to 200 micrometers, preferably 5 to 100 micrometers, and more preferably 5 to 30 micrometers.

(1-2) Internal Electrode Layer

The internal electrode layer for example is formed by molding of a paste including an organic binder and an electrode material by use of a known method such as screen printing or the like. The internal electrode layer is disposed between the two piezoelectric/electrostrictive films, and preferably is configured from a metal that is solid at ambient temperature and that exhibits superior conductivity. For example, the metal, or an alloy thereof, includes aluminum, titanium, chrome, iron, cobalt, nickel, copper, zinc, niobium, molybdenum, ruthenium, palladium, rhodium, silver, tin, tantalum, tungsten, iridium, platinum, gold, lead, or the like. The electrode layer preferably contains at least one metal selected from the group consisting of Pt, Pd, Ru, Rh, Ni, Cu, Ag, Os, and Ir. The size of the electrode particles that configure the electrode layer is preferably 0.05 to 1.5 micrometers.

The thickness of the electrode layer is for example 0.3 to 2.0 micrometers, preferably 0.5 to 1.8 micrometers, and still more preferably 0.8 to 1.5 micrometers. The thickness ratio ((film thickness of piezoelectric/electrostrictive film)/(film thickness of internal electrode layer)) of the piezoelectric/electrostrictive film and the electrode layer that configures the piezoelectric/electrostrictive element is preferably 2 to 200, and more preferably 5 to 100.

(1-3) Side Surface Electrode

The side surface electrode can be formed in the same manner as the internal electrode layer. The internal electrode layer and the side surface electrode may contain the same metal, or may contain different metals.

(1-4) Electrode Exposed Surface

The internal electrode layer 4 and 43 to 45 in the piezoelectric/electrostrictive element 20, 40 in FIG. 1 to FIG. 3 includes an exposed portion 46, and a portion 47 covered by a component of the piezoelectric/electrostrictive film 22 and 24 to 26 for example. The internal electrode layer 4 and 43 to 45 may be configured by use of the coating process described below (coating of predetermined solvent onto the electrode exposed surface before firing) to suitably sag a portion of the piezoelectric/electrostrictive film 22 and 24 to 26 before firing, and cover a portion of the layer exposed on the side surface of the internal electrode layer 4 with a component of the piezoelectric/electrostrictive film. Furthermore, the electrode exposure ratio may be adjusted by adjusting the grain size of the material that configures the internal electrode, the resin content amount of the paste used to prepare the electrode and the piezoelectric/electrostrictive film, and the method of cutting the green sheet.

In the piezoelectric/electrostrictive element according to the present invention, the surface coverage ratio of the exposed electrode surface by the internal electrode layer (electrode exposure ratio) electrode exposure ratio of the internal electrode layer(s) on the electrode exposed surface which is the side surface extending in the stacking direction is more than 0% and less than or equal to 10%, and preferably 0% and less than or equal to 5%. The electrode exposure ratio of 0% (for example, when the side surface in the stacking direction is completely coated with a material other than an electrode material) causes a reduction in the electrode surface area of the element that is finally obtained, or a reduction in the electrostrictive properties due to an increase in the piezoelectric binding force. When the electrode exposure ratio exceeds 10%, deterioration of the insulating properties for high humidity conditions occurs.

The electrode exposure ratio by the internal electrode layer (electrode exposure ratio) is specifically calculated as shown below in Formula (1).

$$\text{The electrode exposure ratio (\%)} = A1/(L1 \times L2) \times 100) \tag{1}$$

Wherein, A1 denotes an exposed area of the internal electrode layer(s) exposed on an active portion of the electrode exposed surface, L1 denotes the average thickness of the internal electrode layer(s) (reference is made to FIG. 2 and FIG. 3), and L2 denotes a sum length of each of the internal electrode layer(s) in the lengthwise direction on the active portion of the electrode exposed surface. As used herein, the active portion as shown in FIG. 2 and FIG. 3 is the portion at which the internal electrode faces the electrode provided on the upper surface and the lower surface of the body part 1, or is the portion at which the upper and lower internal electrodes provided in a comb shape face each other. Reference numeral 5 denotes the inactive portion and reference numeral 3 denotes the active region. The L2 which is the sum length of each of the internal electrode layer(s) in a lengthwise direction on the active portion is total of the electrode length L21 of the portion facing the electrode provided on the upper surface or the lower surface of the body portion 1 and the electrode length L22 of the portion facing the upper and lower internal electrodes provided in a comb shape. The L2 is calculated with reference to the greater length of those lengths when the internal electrode includes both L21 and L22. For example, the element in FIG. 2 is such that L2=L21, and the element in FIG. 3 is such that L2=L22×3.

The number of layers n in the internal electrode layer may be an integer from 1 to 10, preferably takes a value of 2 to 10, and still more preferably takes a value of 2 to 5.

The size of the exposed portion of the electrode layer is preferably 0.5 to 20 with a ratio of L3/L1 after firing (L3 is the length in the lengthwise direction (reference is made to FIG. 2 and FIG. 3) for each exposed portion unit of the exposed portion, and L1 is the same as described above). The L3/L1 ratio of the size of the exposed portion of the electrode layer may be calculated by use of SEM electron micrograph.

In the present invention, the electrode exposure ratio of the exposed electrode surface on the side surface in the stacking direction, the L3/L1 ratio of the size of the exposed portion of the electrode layer, and the length L3 can be adjusted by selecting a combination of the coating solvent and the binder contained in the piezoelectric/electrostrictive green film described below.

The piezoelectric/electrostrictive element according to the present invention when compared to a conventional element enables a more than 10-time enhancement in the high humidity insulating properties (for example, test conditions: 85 degrees C. 85%, 1±1/V micrometers, 6 KHz sinewave etc). Furthermore, the use amount of the electrode can be reduced. In addition, while enhancing the high humidity insulating properties, the displacement capacity can be maintained to a conventional level (less than or equal to -1%).

(2) Method of Manufacture of Film-Type Piezoelectric/Electrostrictive Element

Figure 4:
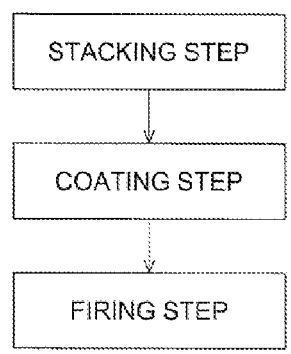
FIG. 4 illustrates the processing steps of a manufacturing method for the film-type piezoelectric/electrostrictive element according to the first aspect of an embodiment of the present invention.

The method of manufacture of film-type piezoelectric/electrostrictive element according to the present invention as illustrated in FIG. 4 may include a stacking step, a coating step and a firing step. In the present specification, the term "green sheet" denotes a stacked body before firing, and the term "film-type piezoelectric/electrostrictive element" denotes the stacked body after firing. The coating step may be omitted.

(2-1) Stacking Step (2-1-1) Green Sheet

In the stacking step, a green sheet is manufactured by two layers of a piezoelectric/electrostrictive green film and an internal electrode layer provided between the piezoelectric/electrostrictive films to provide a pair of side surface electrodes on the two opposing side surfaces in the stacking direction of the green sheet. The piezoelectric/electrostrictive green film in the green sheet includes a binder. The two piezoelectric/electrostrictive green films may have the same composition, or a different composition. The respective electrode layers may have the same composition, or a different composition.

Figure 5:
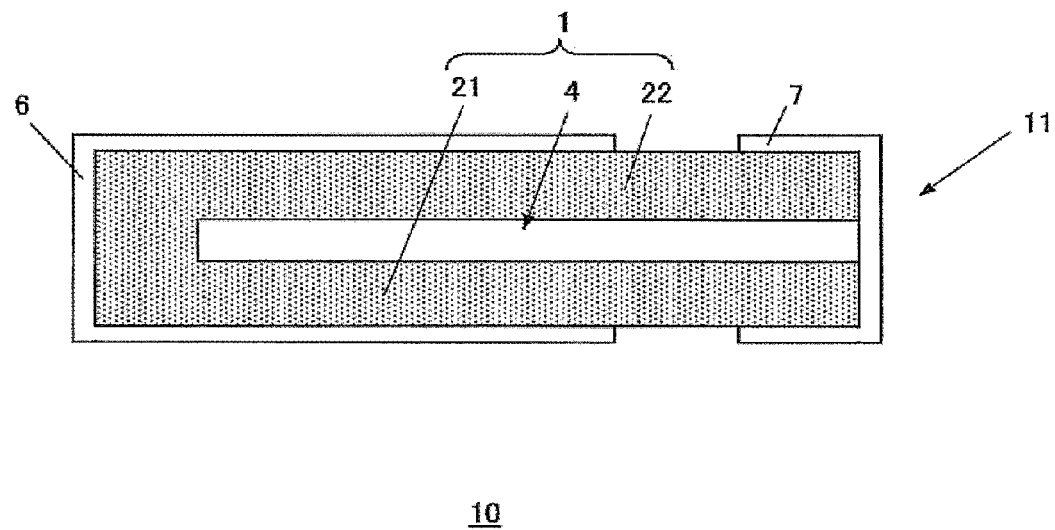
FIG. 5 schematically illustrates the electrode exposed surface of a green sheet for the film-type piezoelectric/electrostrictive element according to the first aspect of an embodiment of the present invention.
Figure 6:
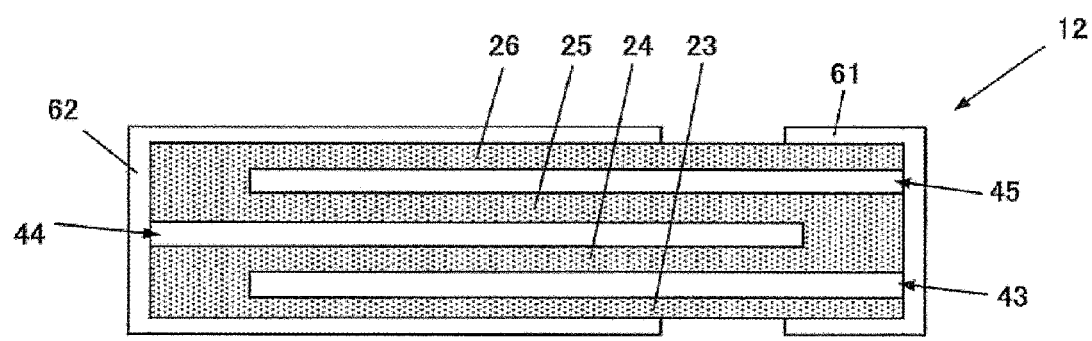
FIG. 6 schematically illustrates the electrode exposed surface of a green sheet for the film-type piezoelectric/electrostrictive element according to an aspect of another embodiment of the present invention.

FIG. 5 schematically illustrates the electrode exposed surface 11 of the green sheet 10 for the film-type piezoelectric/electrostrictive element according to an aspect of an embodiment of the present invention. The green sheet 10 is a green sheet corresponding to the film-type piezoelectric/electrostrictive element 20. The body part 1 of the green sheet 10 is configured by stacking, in order from the bottom, the piezoelectric/electrostrictive green film 21, the internal electrode layer 4, and the piezoelectric/electrostrictive green film 22. FIG. 6 schematically illustrates the electrode exposed surface 12 of a green sheet 30 for the film-type piezoelectric/electrostrictive element according to another aspect of an embodiment of the present invention. The green sheet 30 is a green sheet corresponding to a film-type piezoelectric/electrostrictive element 40. FIG. 5 and FIG. 6 schematically illustrate a state in which the entire average thickness in the internal electrode layer 4, 43 to 45 is exposed.

(2-1-2) Piezoelectric/Electrostrictive Green Film Containing Binder Preparation of Ceramic Powder The piezoelectric/electrostrictive green film containing a binder can be suitably manufactured according to a conventional method. The starting material for the piezoelectric/electrostrictive film includes use of the oxides exemplified above. More specifically, for example, after creating a uniform mixture in a ball mill or the like of a solvent and the metal oxide starting material powder that is the starting material for the piezoelectric/electrostrictive film, the solvent is evaporated and the oxide starting materials are calcined at a reaction temperature. The calcined body is coarsely milled, and then milled using a ball mill or the like with a solvent and dried to obtain a ceramic powder having a predetermined average grain diameter. The average grain diameter of the ceramic powder is 0.01 to 50 micrometers, preferably 0.03 to 10 micrometers and still more preferably 0.03 to 1.5 micrometers.

Preparation of Slurry

The resulting ceramic powder is mixed in a ball mill or the like with a solvent, other additives and a binder, and kneaded to form a slurry. The binder includes a water-based binder or a non-water based binder.

The binder resin in the water-based binder for example includes methyl cellulose based resins such as hydroxypropylmethyl cellulose (SP value (solubility parameter) 20 to 29 $MPa^{1/2}$), methyl cellulose (SP value 20 $MPa^{1/2}$), carboxylmethyl cellulose (SP value 28 to 40 $MPa^{1/2}$), or the like, polyvinyl alcohol based resins such as polyvinyl alcohol (SP value 25 to 35 $MPa^{1/2}$), polyethylene oxide, acrylic resins, or the like.

The non-water based binder for example includes ethyl cellulose based resins such as hydroxyethyl cellulose (SP value 23 $MPa^{1/2}$), ethyl cellulose (SP value 19 $MPa^{1/2}$), or the like, polyvinyl butyral based resins such as polyvinyl butyral (SP value 21 to 32 $MPa^{1/2}$), acrylic resins such as (meth)acrylic resin, (meth) acrylic ester copolymer, acrylic ester-methacrylate copolymer, or the like.

Of the above substances, the binder is preferably a polyvinyl butyral based resin or ethyl cellulose based resin.

The content amount of the binder is preferably 5 to 20 parts by mass relative to 100 parts by mass of the ceramic starting material. Formation of cracks can be inhibited when a green sheet is prepared by forming a slurry of the starting material with reference to the above binder content amount.

In the present specification, the SP value is calculated by use of the following formula.

$$SP\ value = \sqrt{((\delta d)^2 + (\delta p)^2 \pm (\delta h)^2)}$$

Wherein: the required values ($\delta d$, $\delta p$, $\delta h$) are calculated using values from the software database (Hansen Solubility Parameter in Practice (HSPiP), or by use of values inferred from the molecular structures on the same software. An example of the SP value for acetone is calculated below.

Example

Acetone $$20 \approx \sqrt{((15.5)^2 + (10.4)^2 + (7.0)^2)}$$

The other additives for example include dispersing agents, plasticizers, or firing auxiliaries. These additives may be added or not added as required.

The dispersing agent for example includes sorbitan fatty acid esters, ethylene glycol, alkyl amine ethylene oxide adducts, dextrin, fatty acid soap, polyalcohols, or the like. The dispersing agent is preferably 0.5 to 5 parts by mass to 100 parts by mass of the ceramic material, and more preferably 0.5 to 3 parts by mass. When less than 0.5 parts by mass, the dispersing properties of the ceramic starting material may be adversely affected, and a crack may form in the green sheet. When greater than 0.5 parts by mass, the dispersing properties of the ceramic starting material may not change, and impurities during firing may increase.

The plasticizer for example includes dioctyl phthalate, di(2-ethylhexyl) phthalate, or the like. The plasticizer is present in 1 to 5 parts by mass relative to 100 parts by mass of the ceramic starting material. When greater than 5 parts by mass, the green sheet exhibits excessive softness, and may deform during processing of the sheet. When less than 1 part by mass, the green sheet exhibits excessive hardness that may cause deterioration in handling characteristics resulting in crack formation when merely bent.

The firing auxiliary for example includes yttria ($Y_2O_3$), calcic (CaO), magnesia (Mg), and ceria (CeO), or the like. Each of those additives may be used in isolation or in a combination of two or more depending on a purpose. The firing auxiliary may contain 5 to 15 parts by mass to 100 parts by mass of the ceramic starting material.

The solvent for example includes water, a hydrocarbon liquid compound such as oil, alcohol, or the like. The solvent is preferably present in 50 to 200 parts by mass to 100 parts by mass of the ceramic starting material, and more preferably 75 to 150 parts by mass.

Preparation of Film of Piezoelectric/Electrostrictive Green Film

After degassing and adjusting the viscosity of the resulting slurry above, a piezoelectric/electrostrictive green film that includes a binder is formed by molding on a film such as a Pet film or the like, drying and removing the solvent. The method of formation includes for example a doctor blade method, a die coater method, a reverse roll coater method or the like, and of those methods, the die coater method is preferred. The thickness of the piezoelectric/electrostrictive green film is for example 3 to 200 micrometers, preferably 5 to 100 micrometers, and more preferably 5 to 30 micrometers.

(2-1-3) Electrode Layer (Internal Electrode Layer and Side Surface Electrode)

There is no particular limitation on the method for forming the electrode layer in relation to the present invention. The electrode layer may be formed on the piezoelectric/electrostrictive green film by use of various methods such as a screen printing method using a conductive paste, a spin coating or spraying method using a conductive resist solution, plating, or a deposition method such as sputtering or resistance heating deposition, or the like. Even when a side electrode is formed on the side surface of the green sheet, the same formation method as those described above may be used in relation to the side surface.

When using screen printing, the conductive paste may be prepared by adding a binder and a solvent to a powder containing a single metal as described above, or an alloy thereof, and kneading the mixture by use of a tri-roll mill or the like. After printing, the solvent is removed by air scattering, or the like to thereby form the electrode layer. The thickness of the electrode layer after air scattering of the solvent is for example 0.3 to 2.0 micrometers, preferably 0.5 to 1.8 micrometers, and still more preferably 0.8 to 1.5 micrometers. The ratio of the film thickness of the piezoelectric/electrostrictive green film and the film thickness of the electrode film is preferably 2 to 200. The electrode layer on the upper surface and the lower surface of the piezoelectric/electrostrictive green film may be the same film thickness or a different film thickness.

The solvent and the binder used in formation of the electrode layer include the same solvents and binders that have been given as examples in relation to the preparation of the piezoelectric/electrostrictive green film.

The green sheet may include stacking of an intermediate layer such as an adhesion layer between the electrode layer and the piezoelectric/electrostrictive green film. The adhesion layer includes a configuration in which the same ceramic and binder as the piezoelectric/electrostrictive green film is used and only the concentration of the binder is different. The provision of the adhesion layer enhances the adhesive properties of each layer in the stacked body.

(2-2) Coating Step

The coating step is configured to coat solvent onto the electrode exposed surface of the side surface (for example, the cut surface) in the stacking direction of the green sheet. In the stacking step, when the side surface electrode is provided on two opposing side surfaces in the stacking direction of the green sheet, the solvent is coated onto the electrode exposed surface of the side surface that does not have provision of the side surface electrode. The coating step is performed before the firing step. The green sheet is degreased using a normal method.

The coating method of the solvent may be performed using a suitable method that includes screen printing, spraying, brush application, or the like. The coating of the solvent is preferably performed to minimize any enveloping of a portion other than the side surface of the green sheet. When the green sheet formed on the film is cut during the cutting step described below, after cutting of the green sheet, the film is expanded and the solvent may also be sprayed onto the exposed side surface.

In the coating step, coating of the coating solvent on the side surface of the green sheet enables expansion and softening of the piezoelectric/electrostrictive green film in proximity to the exposed side surface, and covering of the electrode surface that is exposed on the side surface. The coverage of the electrode surface may be adjusted by adjusting the coating amount or the selection of the coating solvent. Solvents that are used as the coating solvent are preferably solvents that only attack the electrode surface layer of the piezoelectric/electrostrictive green film based on sheet attack and that are prevented from penetrating as the entire green sheet body deforms.

The coating solvents for use in the coating step are preferably those solvents that exhibit an absolute value $|S1-S2|$ of for example 5 to 15 for the difference of the SP value (S1) of the coating solvent and the SP value (S2) of the binder. An absolute value that is smaller than 5 is not preferred since the green sheet tends to soften. An absolute value that is greater than 15 causes difficulty in reducing the exposed surface area of the electrode, and difficulty in imparting an effect of suppressing a reduction high humidity insulating characteristics.

The coating solvent for example including xylene (SP value 18), ethyl acetate (SP value 18), toluene (SP value 18), butyl carbitol acetate (SP value 18), methyl acetate (SP value 19), methylethyl ketone (SP value 19), texanol (SP value 19), 2,2,4-trimethyl-1,3-pentane diol monoisobutyrate (SP value 19), cyclohexane (SP value 20), ethylene glycol monobutyl ether (SP value 20), 2-ethyl hexanol (SP value 20), and acetone (SP value 20), or the like.

The combinations of the binders contained in the piezoelectric/electrostrictive green film with the coating solvents includes for example butyl carbitol acetate (SP value 18) with polyvinyl butyral (SP value 23 to 28), and 2-ethyl hexanol (SP value 20) with polyvinyl alcohol (SP value 25 to 35).

(2-3) Firing Step

In the firing step, the green sheet is fired to manufacture the piezoelectric/electrostrictive element. The firing temperature is suitably selected in response to the material that configures the electrode layer and the piezoelectric/electrostrictive green film. The firing process removes organic substances such as the binder by vaporization. The firing process is performed for a period of 30 minutes to 4 hours at 600 to 1500 degrees C.

(2-4) Cutting Process

Figure 7:
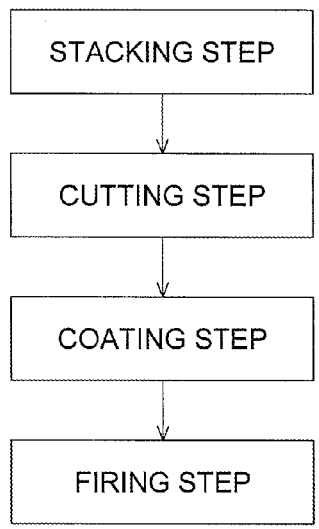
FIG. 7 illustrates the processing steps of a manufacturing method for the film-type piezoelectric/electrostrictive element according to an aspect of another embodiment of the present invention.

The method of manufacturing the film-type piezoelectric/electrostrictive element according to the present invention as illustrated in FIG. 7 may include a cutting process, prior to the coating process, that is configured to cut the green sheet prepared in the stacking process and. The cutting process is configured to enable cutting of the green sheet to predetermined dimensions so that the side surface (partal surface) is exposed in relation to the new stacking direction in the green sheet. Knife cutting facilitates exposure of the electrode on the partal surface. For example, when the green sheet is a green sheet for use as a piezoelectric actuator in which there is alternate stacking of a plurality of piezoelectric ceramic layers and electrode layers, a green sheet of 100 mm×100 mm can be cut to a size of 1.0 mm×1.0 mm. The cutting process is preferably performed before firing.

(2-5) Burr Removal Process

The method of manufacturing the film-type piezoelectric/electrostrictive element according to the present invention may include a burr removal process configured to remove burrs on the green sheet prior to the coating process above. When a cutting process is included, the burr removal process may be performed before the coating process and after the cutting process. When the green sheet is subjected to knife cutting during the cutting process, the portion (edge portion of upper surface) at which the upper surface and side surface of the green sheet intersect describes an acute angle resulting in the production of burrs in that portion. In this configuration, the burrs may be removed by grinding. Furthermore, an inclined portion that projects downwardly towards the outer side on the edge portion of the upper surface of the green sheet can be formed by pressing a resilient body from above onto the green sheet to thereby form an arcuate portion at the portion of interpart between the inclined portion and the side surface of the green sheet. The formation of the inclined portion may be omitted.

(3) Multilayer Body (3-1) Stacking Process

The multilayer body may be manufactured by use of the above method by further sequential stacking of the electrode layer and the piezoelectric/electrostrictive film onto the stacked body that is configured by respectively stacking an electrode layer onto both surfaces of the piezoelectric/electrostrictive film. Furthermore, a plurality of stacked bodies may be manufactured in which the electrode layer and the piezoelectric/electrostrictive film are stacked in one set. In this configuration, after positioning the resulting stacked bodies to form a predetermined number of stacking layers, the layers can be integrated through application of pressure for example by use of uniaxial hot pressing. The multilayered body may include the adhesion layer above.

For example, the green sheet may be manufactured by the following procedure.

(1) A stacked body is formed in which the adhesion layer and the piezoelectric/electrostrictive film are sequentially stacked on a PET film. This operation is repeated twice. That is to say, two stacked bodies are prepared.

(2) A stacked body is formed in which the electrode layer and the piezoelectric/electrostrictive film are sequentially stacked on a PET film. This operation is repeated twice. That is to say, two stacked bodies are prepared.

(3) The stacked bodies obtained in (2) are vertically inverted onto the stacked bodies obtained in (1), pressed and bonded, and the PET film is removed. That is to say, two stacked bodies are prepared.

(4) The electrode layer and the adhesion layer are sequentially stacked, pressed and bonded onto the stacked body obtained in (3).

(5) Only an adhesion layer is stacked, pressed and bonded onto the stacked body obtained in (3).

(6) The stacked bodies obtained in (5) are vertically inverted onto the stacked bodies obtained in (4), is pressed and bonded, and the PET film is removed.

(7) Respective side surface electrodes are formed by sagging the electrode paste onto the two opposing side surfaces in the stacking direction of the stacked body obtained in (6).

(3-2) Coating Process

In the same manner as above, a predetermined adhesive is coated onto the side surfaces on which the side electrode of the green sheet obtained in the above stacking process is not formed.

(3-3) Firing Process

A film-type piezoelectric/electrostrictive element is obtained by firing the green sheet after the above coating process at a suitable temperature.

(4) Actuator, Ultrasonic Sensor, Acceleration Sensor, Angular Velocity Sensor, Impact Sensor, Mass Sensor The piezoelectric/electrostrictive element can be used as an actuator configured to control a position of a target object. The target object includes an optical lens, a magnetic head, an optical head, or the like. A potential difference in the piezoelectric/electrostrictive element above is generated between the electrode group in response to a deformation amount of the piezoelectric/electrostrictive film (or body part). This principle enables use of the piezoelectric/electrostrictive element in a configuration of various sensors such as an ultrasonic sensor, an acceleration sensor, an angular velocity sensor, an impact sensor, a mass sensor, or the like. Thereby, suppression is enabled of problems such as a reduction in the insulation characteristics of the ultrasonic sensor, the acceleration sensor, the angular velocity sensor, the impact sensor, the mass sensor, or the like on the side in the stacking direction that causes in a decrease in electrical energy efficiency resulting from a leakage current and leads to product failure due to short circuiting between the electrodes.

EXAMPLES

Although the present invention will be described in further detail based on the examples, the present invention is not thereby limited to those examples.

Examples 1 to 3, Comparative Example

Figure 8:
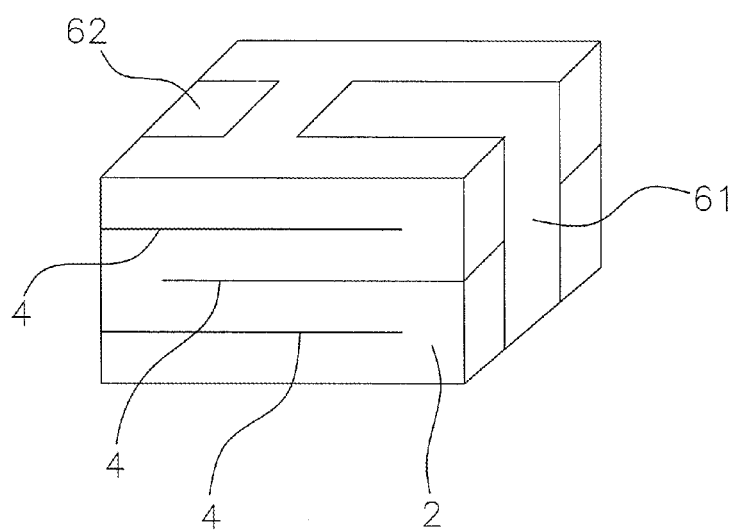
FIG. 8 is a perspective view schematically illustrating a film-type piezoelectric/electrostrictive element according to an example.
Figure 9:
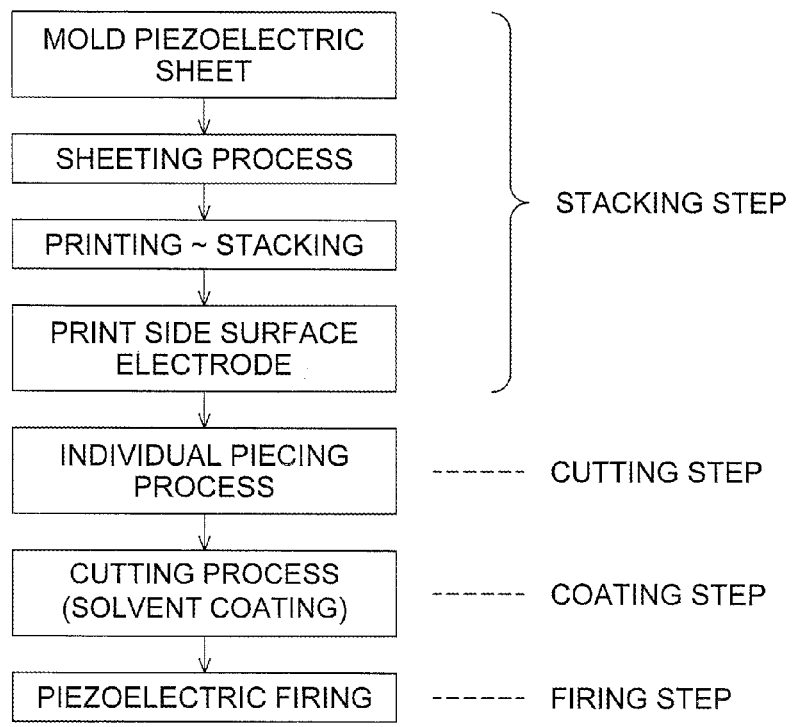
FIG. 9 illustrates the processing steps of a manufacturing method for the film-type piezoelectric/electrostrictive element according to an example.
Figure 10:
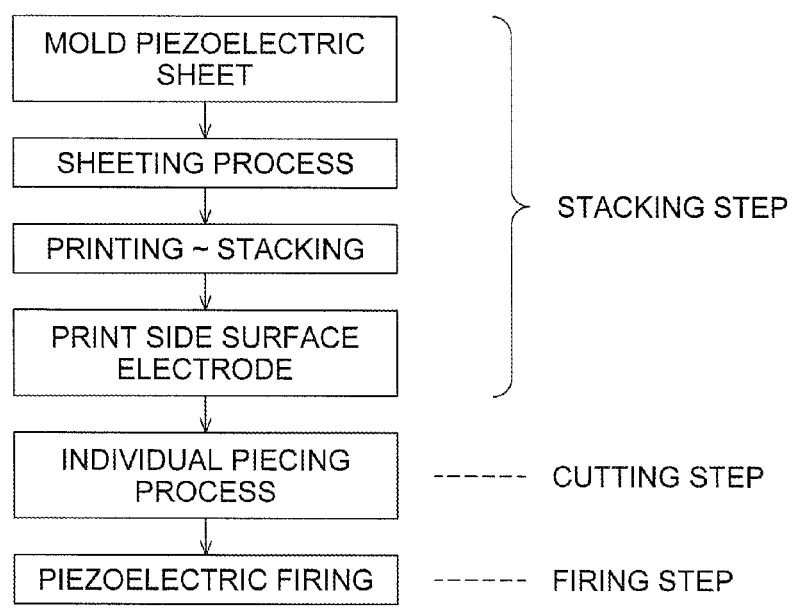
FIG. 10 illustrates the processing steps of another manufacturing method for the film-type piezoelectric/electrostrictive element according to an example.

A film-type piezoelectric/electrostrictive element as illustrated in FIG. 8 was manufactured using the steps illustrated in FIG. 9 (Examples 2 and 3), or the steps illustrated in FIG. 10 (Example 1, Comparative Example). Firstly, a PZT-based piezoelectric powder, a binder resin (butyral resin having an SP value of 25), a plasticizer, and a dispersing agent are mixed and kneaded to thereby prepare a piezoelectric slurry. After degassing and adjustment of the viscosity of the piezoelectric slurry, a tape casting method is used to mold a piezoelectric sheet onto a PET film configured as a sheet having a thickness of approximately 10 micrometers. Then, the piezoelectric sheet is cut to a suitable length. An adhesive paste and electrode conductive paste (having an average particle size as illustrated in Table 1 of 0.3 micrometers, or 0.5 micrometers) are printed onto the sheet to prepare a stacked green sheet. The stacked body is placed onto the adhesive sheet and cut to a 1.0 mm width. Side surface electrodes are printed by use of the electrode conductive paste onto the side surface in the lengthwise direction of the bar (corresponding to the stacking process above). The thickness of the piezoelectric/electrostrictive film is about 15 micrometers, and the thickness of the electrode layer is about 1.0 micrometer. The thickness of the stacked green sheet is about 0.06 mm. The green sheet is cut perpendicular to the lengthwise direction when viewed in plan by use of a dicer (individual piecing process). The size of each piece is 1.0×1.0×0.05 mm (height). In FIG. 8, reference numeral 2 denotes the piezoelectric/electrostrictive film, reference numeral 4 denotes the electrode layer, and reference numerals 61, 62 denote the side surface electrodes.

In Example 1, the resin content of the paste for use in relation to the film-type piezoelectric/electrostrictive film and the electrode, and the method of cutting of the green sheet are suitably adjusted to thereby prepare an element in which an active portion electrode exposure ratio is more than 0 and less than or equal to 10%. The samples in Examples 2 and 3 use BCA (butylcarbitolacetate) as a coating solvent onto the cut surface. The firing conditions during the firing process are a maximum temperature 1200 degrees C. and a maintenance time of 3 hours.

Evaluation

Cross-Partal Structure

Figure 11:
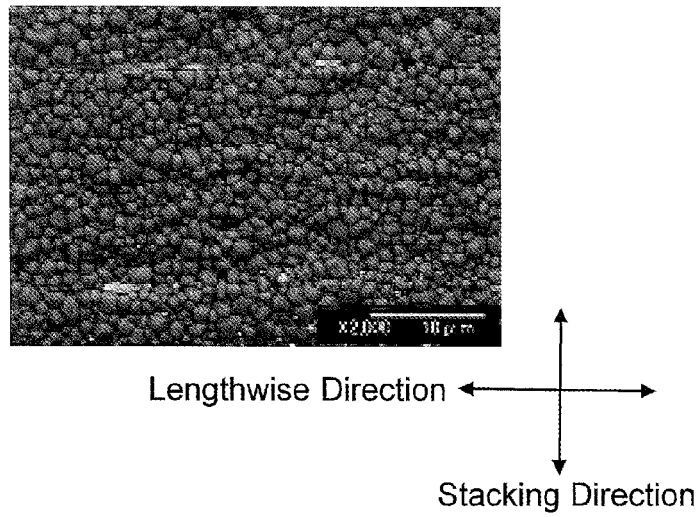
FIG. 11 is a scanning electron micrograph illustrating the detailed structure of the internal electrode layer and the piezoelectric/electrostrictive film in the electrode exposed surface of the film-type piezoelectric/electrostrictive element according to an example.
Figure 12:
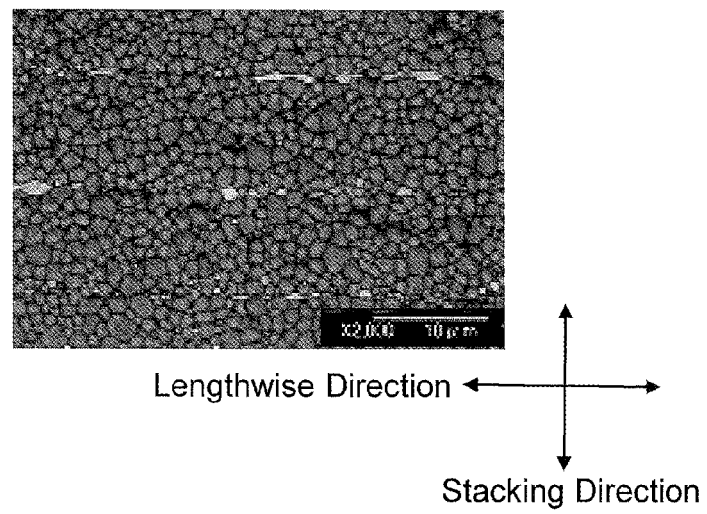
FIG. 12 is a scanning electron micrograph illustrating the detailed structure of the internal electrode layer and the piezoelectric/electrostrictive film in the electrode exposed surface of the film-type piezoelectric/electrostrictive element according to a comparative example.

The microstructure of the side surface without formation of the side surface electrodes of the film-type piezoelectric/electrostrictive element are observed using an RE-SEM manufactured by JEOL. FIG. 11 and FIG. 12 illustrate a scanning electron micrograph of the side surface in the stacking direction of the film-type piezoelectric/electrostrictive element in Example 3 and the Comparative Example. The film-type piezoelectric/electrostrictive element (FIG. 12) of the Comparative Example is confirmed to exhibit a clearly exposed electrode layer. In contrast, the exposure of the electrode layer is suppressed in the film-type piezoelectric/electrostrictive element (FIG. 11) of Example 3. The same comments apply to Examples 1 and 2 in which the exposure of the electrode layer is suppressed.

Electrode Exposure Ratio on Side Surface

The electrode exposure ratio, on the side surface on which the side surface electrode is not formed, is calculated using Formula (1) above with reference to the image analysis on the basis of a transmission observation of the electrode film using a microscope.

High Humidity Insulation Testing

Figure 13:
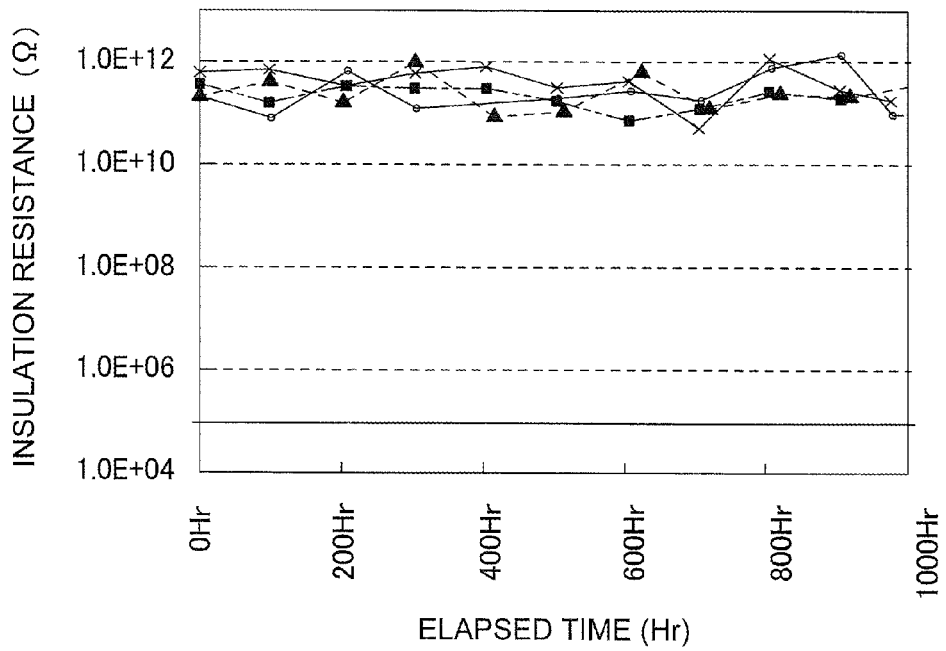
FIG. 13 is a graph illustrating the results of high humidity insulation testing of the film-type piezoelectric/electrostrictive element according to an example.
Figure 14:
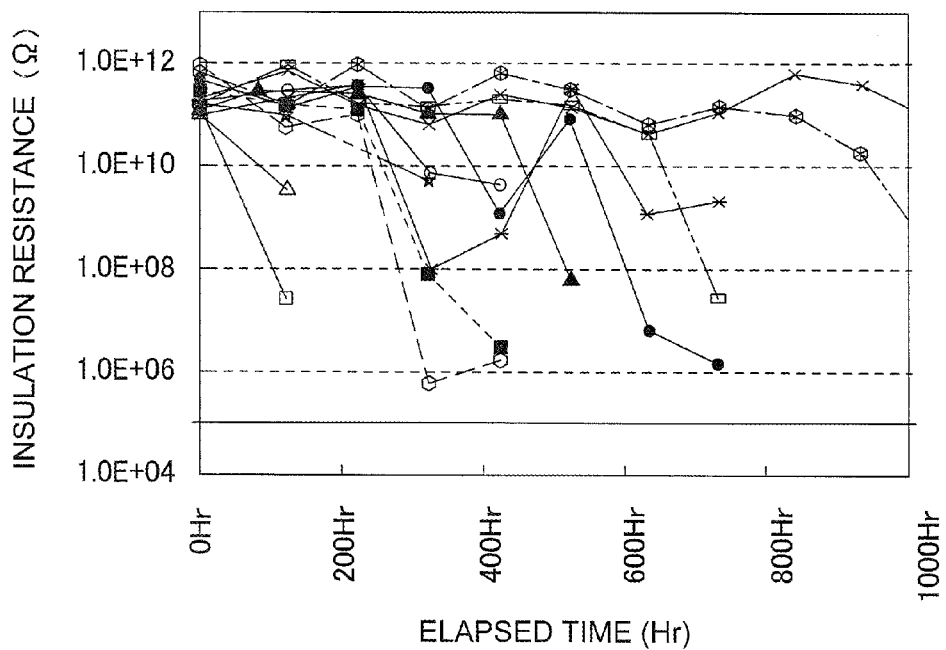
FIG. 14 is a graph illustrating the results of high humidity insulation testing of the film-type piezoelectric/electrostrictive element according to a comparative example.

The plurality of pieces of the film-type piezoelectric/electrostrictive element obtained in Examples 1 to 3, and the film-type piezoelectric/electrostrictive element obtained in the Comparative Example are subjected to high humidity insulation testing by application of a 1±1V/micrometer 6 kHz sinewave voltage between the electrodes 61 and 62 in an environment of 85 degrees C. and 85% humidity. FIG. 13 and FIG. 14 respectively illustrate the test results for the film-type piezoelectric/electrostrictive element of Example 3 and the Comparative Example. The element according to the Comparative Example that exhibits an electrode exposure ratio that exceeds 10% is observed undergo failure of the insulation after the elapse of about 200 hours resulting in variable performance. In contrast, the element according to Example 3 maintains insulation characteristics even under high humidity. The elements according to Examples 1 and 2 obtain the same effect as Example 3.

TABLE 1

|  | Example 1 | Example 2 | Comparative Example | Example 3 |
|---|---|---|---|---|
| Pt grain diameter (micrometers) | 0.3 | 0.3 | 0.5 | 0.5 |
| Coating Solvent | none | BCA | none | BCA |
| Electrode Exposure Ratio (%) | 5% | 0.1% | 22% | 10% |
| Reliability | ○ | ○ | X | ○ |

The piezoelectric element in which the electrode exposure ratio on the side surface is adjusted is shown to exhibit extremely superior reliability. Based on the observation of the cross-partal structure of the piezoelectric element in Examples 1 to 3, a portion of the electrode exposed surface of the side surface is covered by ceramic. Since only a portion of the side surface is covered with ceramic, movement tends not to be inhibited, and the displacement amount as an actuator can be maintained. Furthermore, an actuator, an ultrasonic sensor, an acceleration sensor, an angular velocity sensor, an impact sensor, or a mass sensor that include the piezoelectric element exhibit superior insulation characteristics under high humidity, and enable driving operation for long periods of time.

What is claimed is:

1. A film-type piezoelectric/electrostrictive element which is a fired object comprising:
    a body part having n+1 layered piezoelectric/electrostrictive films and n layered internal electrode layer(s), the piezoelectric/electrostrictive films composed of ceramic, the piezoelectric/electrostrictive films and the internal electrode layer(s) stacked in an alternating manner, the n being an integer equal to 1 or more;
    a pair of side-surface electrodes positioned on two opposing side surfaces of the body part, the two opposing side surfaces extending in a stacking direction of the body part;
    the internal electrode layer(s) exposed on an electrode exposed surface of the body part, the electrode exposed surface extending in the stacking direction; and
    an electrode exposure ratio of the internal electrode layer(s) on the electrode exposed surface as defined by Formula (1) being more than 0% and less than or equal to 10%, the electrode exposure ratio (%)=$A1/(L1 \times L2) \times 100$    (1)

wherein A1 denotes an exposed area of the internal electrode layer(s) exposed on an active portion of the electrode exposed surface, L1 denotes an average thickness of the internal electrode layer(s), L2 denotes a sum length of each of the internal electrode layer(s) in a lengthwise direction on the active portion of the electrode exposed surface, and the lengthwise direction is perpendicular to the stacking direction.

2. The film-type piezoelectric/electrostrictive element according to claim 1, wherein
    the internal electrode layer(s) has/have a plurality of exposed portions on the electrode exposed surface,
    a size of each of the exposed portions exhibits a ratio of L3/L1 after firing of 0.5 to 20, and
    L3 denotes a length of each of the exposed portions in the lengthwise direction on the internal electrode layer(s).

3. The film-type piezoelectric/electrostrictive element according to claim 1, wherein
    a film thickness of the piezoelectric/electrostrictive films is 3 to 200 micrometers.

4. The film-type piezoelectric/electrostrictive element according to claim 1, wherein
    a thickness of the internal electrode layer(s) is 0.3 to 2.0 micrometers.

5. The film-type piezoelectric/electrostrictive element according to claim 1, wherein
    a ratio of a film thickness of the piezoelectric/electrostrictive films to a film thickness of the internal electrode layer(s) is 2 to 200.

6. The film-type piezoelectric/electrostrictive element according to claim 1, wherein
    the n takes a value of 1 to 10, and
    the n layered internal electrode layer(s) are/is disposed in a staggered comb-like configuration in the stacking direction on the electrode exposed surface.

7. The film-type piezoelectric/electrostrictive element according to claim 1, wherein
    the piezoelectric/electrostrictive films contains at least one oxide, or a mixture of oxides, selected from the group consisting of lead zirconate, lead titanate, lead magnesium niobate, lead nickel niobate, lead zinc niobate, lead manganese niobate, lead antimony stanate, lead manganese tungstate, lead cobalt niobate, barium titanate, bismuth sodium titanate, sodium potassium niobate, strontium bismuth tantalite.

8. The film-type piezoelectric/electrostrictive element according to claim 1, wherein
the internal electrode layer(s) contains/contain at least one type of metal selected from the group consisting of Pt, Pd, Ru, Rh, Ni, Cu, Ag, Os and Ir.

9. An actuator, an ultrasonic sensor, an acceleration sensor, an angular velocity sensor, an impact sensor, or a mass sensor comprising the piezoelectric/electrostrictive element according to claim 1.

* * * * *